(12) United States Patent
Horak et al.

(10) Patent No.: US 8,232,204 B1
(45) Date of Patent: Jul. 31, 2012

(54) METHOD OF FORMING BORDERLESS CONTACT FOR TRANSISTOR

(75) Inventors: David V. Horak, Essex Junction, VT (US); Charles W. Koburger, III, Albany, NY (US); Steven J. Holmes, Hopewell Junction, NY (US); Shom Ponoth, Albany, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/171,527

(22) Filed: Jun. 29, 2011

(51) Int. Cl.
*H01L 21/44* (2006.01)

(52) U.S. Cl. ............... 438/675; 438/781; 257/E21.585

(58) Field of Classification Search ........... 257/E21.532, 257/E21.533, E21.534
See application file for complete search history.

(56) References Cited

U.S. PATENT DOCUMENTS

| | | | |
|---|---|---|---|
| 5,456,797 A | 10/1995 | Weber et al. |
| 5,651,857 A | 7/1997 | Cronin et al. |
| 5,960,318 A | 9/1999 | Peschke et al. |
| 6,083,824 A | 7/2000 | Tsai et al. |
| 6,168,907 B1 | 1/2001 | Choi et al. |
| 7,037,774 B1 | 5/2006 | Syau |
| 7,582,561 B2 | 9/2009 | Wai et al. |
| 7,897,517 B2 | 3/2011 | Wai et al. |
| 2010/0038723 A1 | 2/2010 | Babich et al. |

*Primary Examiner* — Cheung Lee
(74) *Attorney, Agent, or Firm* — Yuanmin Cai

(57) ABSTRACT

Embodiments of the present invention provide a method of forming borderless contact for transistor. The method may include forming a gate of a transistor, on top of a substrate, and spacers adjacent to sidewalls of the gate; forming a sacrificial layer surrounding the gate; causing the sacrificial layer to expand in height to become higher than the gate, the expanded sacrificial layer covering at most a portion of a top surface of the spacers and thereby leaving an opening on top of the gate surrounded by the spacers; filling the opening with a dielectric cap layer; replacing the expanded sacrificial layer with a dielectric layer; and forming a conductive stud contacting source/drain of the transistor, the conductive stud being isolated from the gate by the dielectric cap layer.

22 Claims, 10 Drawing Sheets

US 8,232,204 B1

METHOD OF FORMING BORDERLESS CONTACT FOR TRANSISTOR

FIELD OF THE INVENTION

The present invention relates generally to the field of semiconductor device manufacturing and in particular relates to method of forming borderless contact for transistor.

BACKGROUND

In the field of semiconductor device manufacturing, active semiconductor devices such as, for example, transistors are generally manufactured or fabricated through processes commonly known as front end of line (FEOL) technologies. A transistor may be, for example, a field-effect-transistor (FET) and may be more specifically a complementary metal-oxide-semiconductor (CMOS) FET. A FET may also be a p-type dopant doped PFET or an n-type dopant doped NFET. Recently, high-k metal gate (HKMG) semiconductor transistors have been introduced because of their superior performance over conventional poly-based CMOS-FET. In addition, a replacement metal gate (RMG) process has been developed to further enhance the performance of HKMG transistors.

Generally, after structure of a transistor is formed, conductive contacts are formed to connect to source, drain, and/or gate of the transistor to make the transistor fully functional. With the continuous scaling down in device dimension in integrated circuitry, real estate for forming corresponding contacts is also becoming smaller and smaller. As a result, contacts that are borderless to gate, which generally requires less real estate and have been used for a while in dynamic random access memory (DRAM), are making their way into logic structures such as transistors.

To form borderless contacts for a transistor manufactured through a non-replacement metal gate (non-RMG) process, normally a $HfO_2$ layer or other types of highly RIE (reactive-ion-etching) resistant etch-stop layer is formed or deposited to cover the gate stack of the transistor before depositing the CA inter-layer dielectric. Metal contacts are then formed next to the etch-stop layer to be borderless to the gate. However, despite demonstrated feasibility of the above approach for transistors made by various non-RMG processes, technical difficulties have been met in trying to apply the above approach to transistors manufactured by a RMG process.

SUMMARY OF EMBODIMENTS OF THE INVENTION

Embodiments of the present invention provide a method of forming borderless contacts for transistors. More particular, one embodiment of the method includes forming a gate of a transistor, on top of a substrate, and spacers adjacent to sidewalls of the gate; forming a sacrificial layer surrounding the gate; causing the sacrificial layer to expand in height to become higher than the gate, the expanded sacrificial layer covering at most a portion of a top surface of the spacers and thereby leaving an opening on top of the gate surrounded by the spacers; filling the opening with a dielectric cap layer; replacing the expanded sacrificial layer with a dielectric layer; and forming a conductive stud in the dielectric layer in contacting source/drain of the transistor, the conductive stud being isolated from the gate by the dielectric cap layer.

In one embodiment, the sacrificial layer is a layer of organic material and wherein forming the sacrificial layer surrounding the gate includes spinning on the organic material on top of the gate and in areas around the gate; and lowering a height of the organic material by polishing or wet-etching the organic material to expose the gate and the spacers surrounding the gate and to create a top surface of the organic material co-planar with, or having a top surface below, that of the gate and the spacers.

In one embodiment, the organic material in areas around the gate is formed directly on top of the substrate covering the source/drain of the transistor. In another embodiment, the organic material in areas around the gate is formed on top of another dielectric layer, a thickness of this another dielectric layer that is formed directly on top of the substrate is adjusted to control the amount of organic material being formed around the gate.

According to one embodiment, causing the sacrificial layer to expand includes subjecting the organic material to a silylation reaction process under a pre-determined temperature, pressure of one or more silylation agents, and time duration. In one aspect of the invention, the temperature, pressure of silylation agents and time duration may be adjusted to control the expansion of the organic material to a range below approximately 67%, and preferably between about 30% and about 50%.

According to one embodiment, the organic material may be a polymer having a chemical component of $(Si(OH)(OR)O_2)$, where R is either an aryl group comprising one or more of phenyl, tolyl, and xylyl, or an alkyl group comprising one or more of methyl, ethyl, propyl, butyl, and t-butyl group. According to another embodiment, the one or more silylation agents may be represented by $(CH_3)_2NSi(R)_3$ wherein R methyl, ethyl, methoxy, or hydrogen or represented by $((CH_3)_2N)_2Si(R)_2$ wherein R is methyl, ethyl, methoxy, or hydrogen.

BRIEF DESCRIPTION OF THE DRAWINGS

The present invention will be understood and appreciated more fully from the following detailed description of preferred embodiments, taken in conjunction with the accompanying drawings of which.

Figure 1:
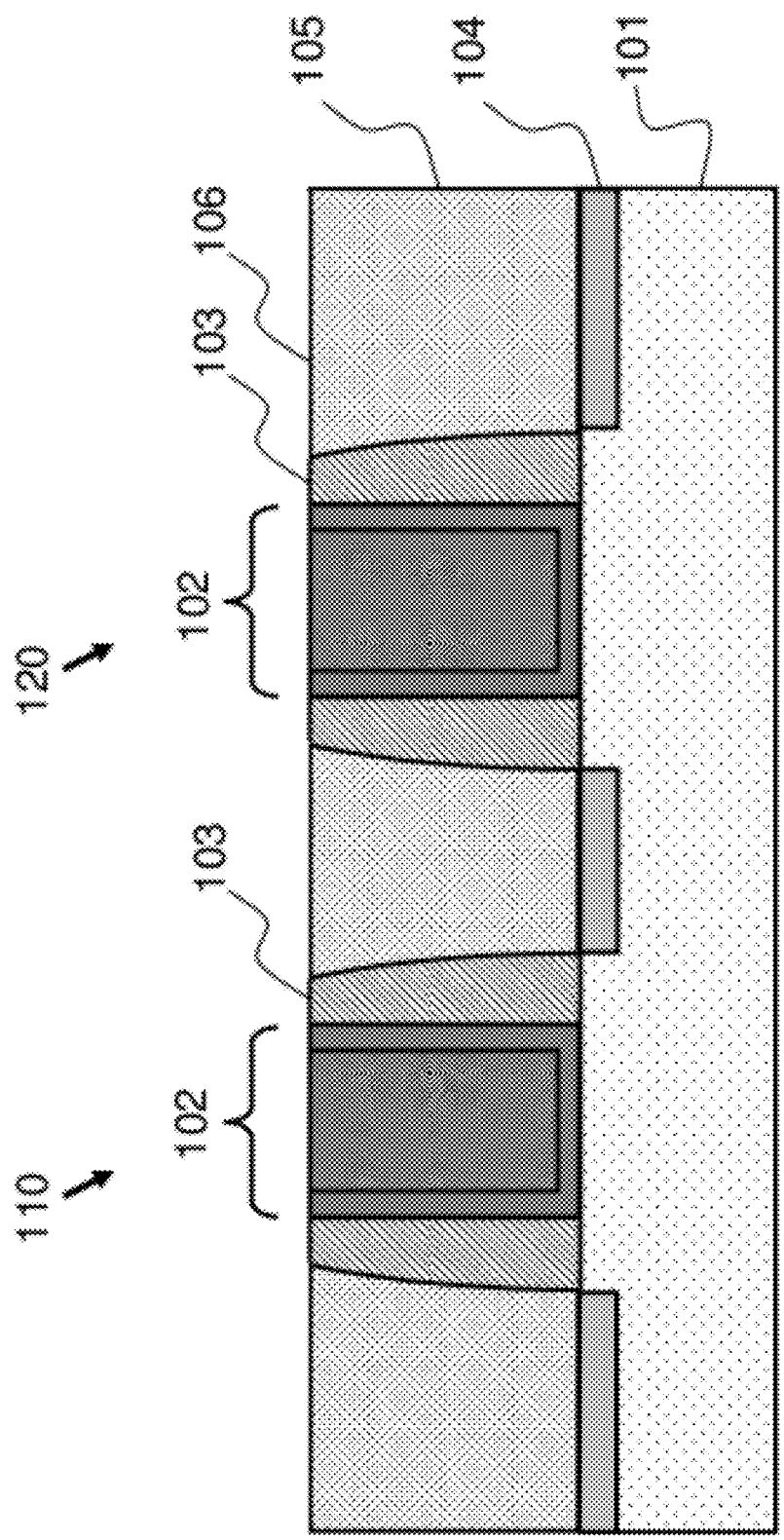
FIG. 1 is a demonstrative illustration of a method of forming borderless contacts for transistors according to an embodiment of the present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of a method of forming borderless contacts for transistors according to an embodiment of the present invention. For example, one embodiment of the method may start with forming one or more transistor structures, such as transistor structures 110 and 120, on a substrate 101. Transistor structures 110 and 120 may be, for example, transistor devices formed by a replacement metal gate (RMG) process. However, a person skilled in the art will appreciate that embodiments of the present invention are not limited in this respect, and the method may be applied to transistors formed by other processes such as, for example, by other non-RMG processes.

Substrate 101 may be a semiconductor substrate suitable for forming transistors thereupon. For example, substrate 101 may be a silicon substrate, a germanium-doped silicon substrate, a strained silicon substrate, a substrate with buried oxide (BOX), or a substrate with strained silicon directly on insulator (SSDOI). Other types of substrate may be used as well. As is known in the art of forming transistors in a RMG process, which is used here as a demonstrative example, a dummy gate is first formed on top of substrate 101 and a conformal dielectric layer is deposited on top of the dummy gate as well as substrate 101. The conformal dielectric layer is subsequently directionally etched through for example a reactive-ion-etching (RIE) process. The directional etching removes most of the conformal dielectric layer and leaves only a fraction thereof that is adjacent to sidewalls of the dummy gate to form spacers 103. Following the formation of spacers 103, source and drain areas next to spacers 103 may be silicided to form silicide contact regions 104.

Next, a blanket dielectric layer 105 may be deposited, which is formed to have a height higher than that of the dummy gate to cover top of the dummy gate, spacers 103, as well as silicide contact regions 104. Subsequently, a chemical-mechanical-polishing (CMP) process may be used to polish down the dielectric layer 105, which eventually opens up the top surface of the dummy gate. The dummy gate is then removed, through for example a RIE process, and openings created by the removal of dummy gates may be re-filled with one or more layers of conductive material which together form a conductive metal gate structure 102. The formation of metal gate structure 102 may be made through well-known techniques such as, for example, plating and/or deposition. Excess of conductive materials (used as part of metal gate structure 102) may be removed by applying a CMP process which creates a top surface 106. As being illustratively shown in FIG. 1, metal gate structure 102 may typically include, for example, one or more work-function metal layer(s) and/or metal liners.

It is to be noted that in the above process, different from a conventional RMG process, dielectric layer 105 is a sacrificial layer which may be removed in a follow-up step according to one embodiment of the present invention. In another embodiment, at least a lower portion of dielectric layer 105 may be left remaining on top of substrate 101, at least temporarily. The remaining portion of dielectric layer 105 may be a sacrificial layer as well in situations where it is removed later. In the case that entire dielectric layer 105 is a sacrificial layer to be removed, the blanket dielectric material that forms dielectric layer 105 may advantageously be a material that may assist in the process of removing dummy gate and forming RMG 102, as well as be removed later selectively, relative to the surrounding silicide contact regions 104 and spacers 103.

In the below description, in order not to obscure description and/or illustration of essence of the present invention, some well known features and elements of transistor structures 110 and 120 may have not been shown in the drawings nor described in detail. For example, in some embodiment, a gate dielectric layer may be formed underneath gate structure 102 and/or multiple work-function layers may be used in forming gate structure 102. In addition, source/drain extensions of transistor structure 110 and/or 120 may be formed in substrate 101 underneath and/or adjacent to spacers 103 but they are not particularly shown in FIG. 1 since they are not essential to the present invention.

Furthermore, a person skilled in the art will appreciate that embodiment of the present invention may not necessarily depend upon certain specific orders and/or steps that different elements of transistor structure 110 and/or 120 are formed and may be exercised in other suitable alternate orders. For the below description purpose, it is assumed, for example, that source/drain silicide contact regions 104 are already formed inside substrate 101.

Figure 2:
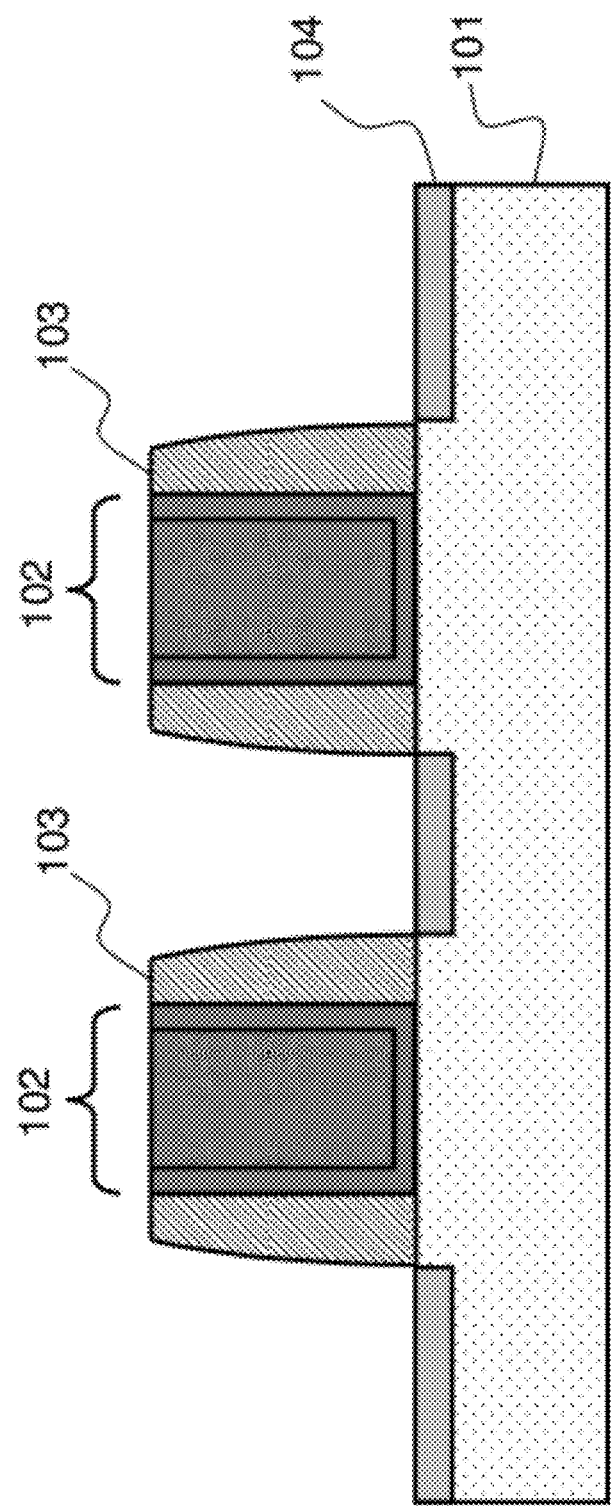
FIG. 2 is a demonstrative illustration of a method of forming borderless contacts for transistors, following the step illustrated in FIG. 1, according to an embodiment of the invention.
Figure 10:
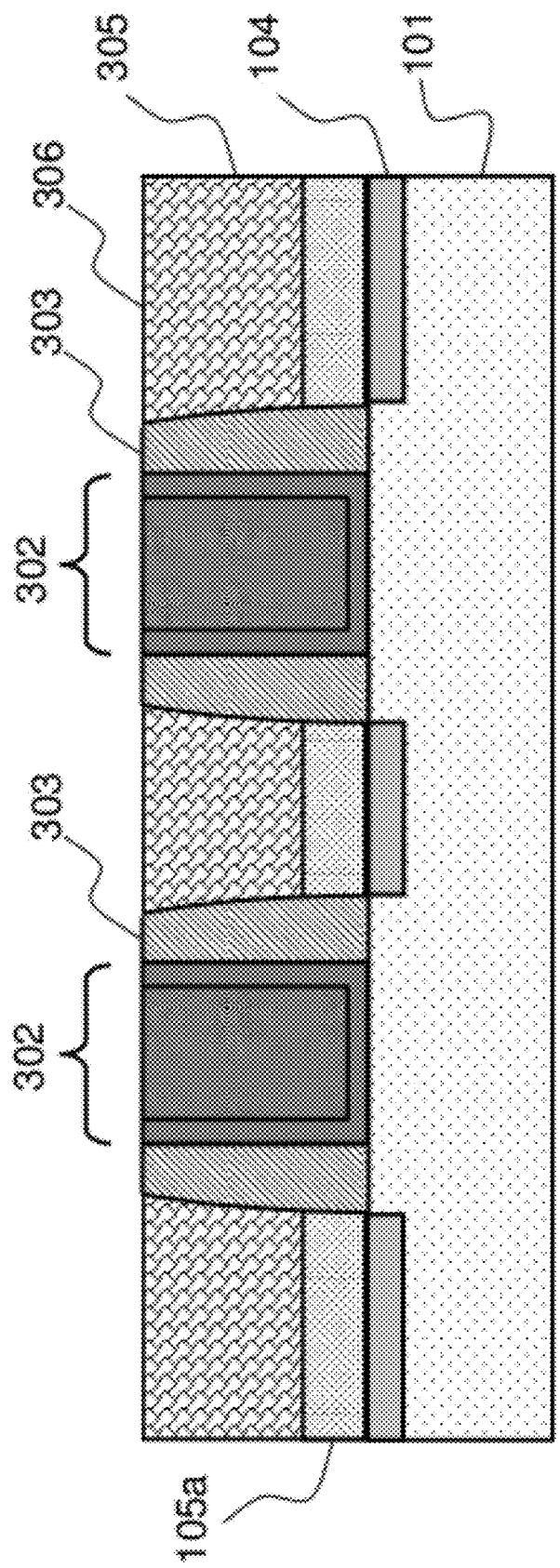
FIG. 10 is a demonstrative illustration of a method of forming borderless contacts for transistors, following the step illustrated in FIG. 2 and FIG. 3, according to another embodiment of the invention.

FIG. 2 is a demonstrative illustration of a method of forming borderless contacts for transistors, following the step illustrated in FIG. 1, according to an embodiment of the present invention. For example, the method may include removing dielectric layer 105, or at least a top portion thereof, that surrounds transistor structures 110 and 120. In the case that only a portion of dielectric layer 105 is removed, as is shown in FIG. 10, the removal may create a recess or recesses, around spacers 103 of metal gate structures 102, with the remaining portion 105a of dielectric layer 105 having a height that is lower than the top surface 106 of the exposed metal gate structure 102. The amount of removal of dielectric layer 105 may be adjusted depending upon the amount of another sacrificial layer 305, which may be an expandable organic material such as polymer as being described below in more details, to be formed around sidewall spacers 103 of gate structure 102. Hereinafter, without losing generality, it is assumed the entire dielectric layer 105 is removed. Removal of dielectric layer 105 maybe performed by a selective RIE process, and/or other wet etch processes such as BHF, DHF. Depending on the type of material of dielectric layer 105, certain strip solvents may be used to remove low-k dielectrics and/or a chemical oxide removal (COR) process may be used in an environment of HF with ammonia vapor.

Figure 3:
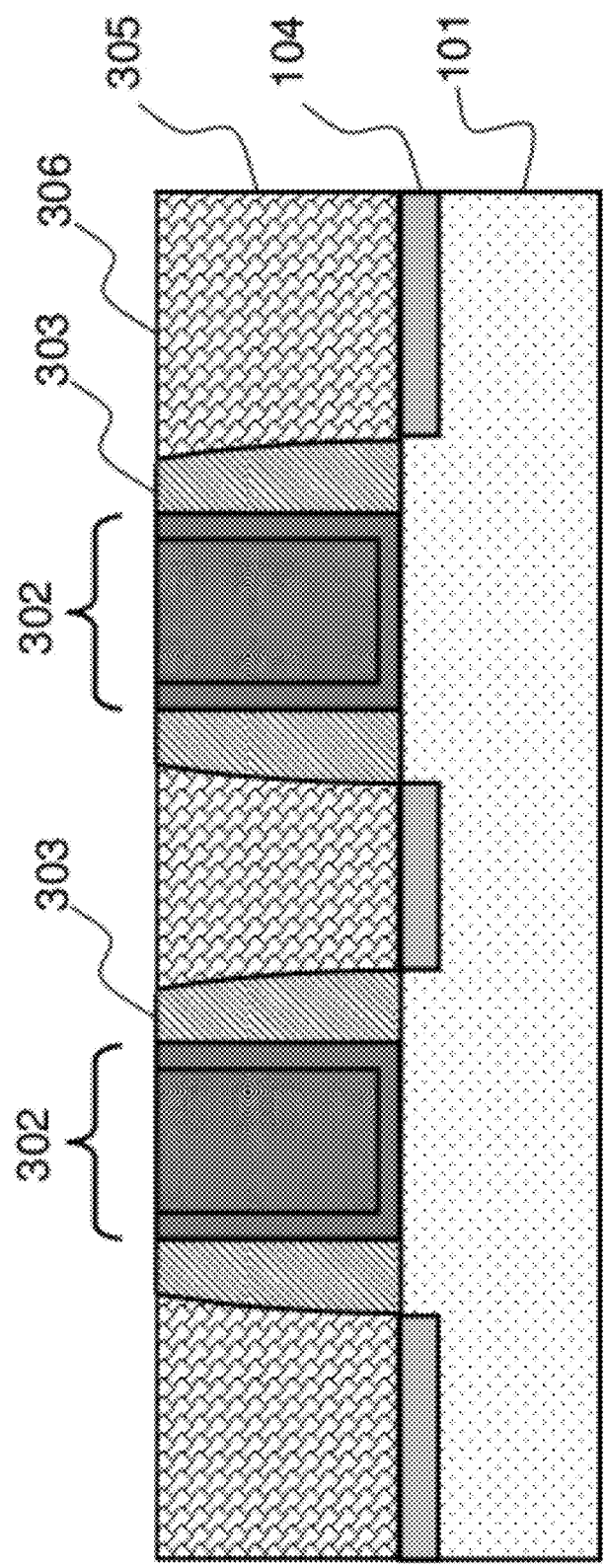
FIG. 3 is a demonstrative illustration of a method of forming borderless contacts for transistors, following the step illustrated in FIG. 2, according to an embodiment of the invention.

FIG. 3 is a demonstrative illustration of a method of forming borderless contacts for transistors, following the step illustrated in FIG. 2, according to an embodiment of the present invention. After dielectric layer 105 is removed, another sacrificial layer of expandable material may be formed on top of exposed substrate 101 in areas surrounding transistor structures 110 and 120. For example, a layer of organic material 305, such as polymer which is able to swell under certain condition, may be applied through, for example, a spin-on process on top of transistor structures 110 and 120 and surrounding areas. After the organic material is applied, it may be solidified through, for example, a curing process in a temperature controlled environment. For example, the curing process may include a baking step where the device may be placed in a both temperature and duration of time controlled environment to remove solvent from the applied solution and the temperature and time duration may be controlled in such a way as not to create a substantial amount of cross-linking in the polymer.

Subsequently, a chemical-mechanical-polishing (CMP) process may be applied to polish down organic material 305 until metal gate structures 102 are no longer covered by organic material 305. The CMP process may create gate structures 302 and spacers 303 which have a height that is equal to or less than that of gate structures 102 and spacers 103, as shown in FIG. 2, and have a top surface that is co-planar with a top surface 306 of organic material 305. In another embodiment, aqueous TMAH (tetra-methyl ammonium hydroxide) or other aqueous based solutions, and/or some solvents, may be used to thin the thickness of sacrificial organic material 305 to reduce its height to be at or below the top surface of gate structure 102. This might be particularly preferable for organic material 305 that are not cross-linked at applying.

In an embodiment where dielectric layer 105 is only partially removed before organic material layer 305 is applied, a resulting structure is demonstratively illustrated in FIG. 10, wherein sacrificial organic material layer 305 is formed on top of the remaining dielectric layer 105a and have a top surface 306 that is co-planar with that of gate structures 302 and spacers 303 surrounding the gate structures 302, as a CMP process generally does. In another embodiment, the top surface 306 of organic material 305 may be slightly below top surface of gate structures 302 or 102 (FIG. 1) in situations where wet etch back is used to lower thickness of organic material 305.

According to one embodiment of the present invention, expandable organic materials suitable for present invention in the above process may include, for example, certain polymers such as those from the maker of Honeywell. The polymer from Honeywell, known as DUO polymer, may contain components that may be expressed as $(Si(OH)(OR)O_2)$, where R is either an aryl group (which is a functional group or substituent derived from a simple aromatic carbon ring) such as a phenyl, tolyl, and/or xylyl group, or an alkyl group (which is a functional group or side-chain that consists solely of single-bonded carbon) such as a methyl, ethyl, propyl, butyl, and/or t-butyl group. Other polymers such as siloxane species, polyhydroxystyrene, novolak, copolymers of styrene and hydroxystyrene, and/or other similar polymers with active hydroxyl groups available for reaction with the swelling agent, as being discussed below, may be used as well.

Some silylation agent may be added to the above DUO polymer as well. Such suitable agents may include, for example, $(CH_3)_2NSi(R)_3$, where R is methyl, ethyl, methoxy, or hydrogen. In another embodiment, the $CH_3$ groups on the nitrogen could be other species such as ethyl or hydrogen. This type of agent (or reagent) generally will not cross-link and is therefore favorable for the swelling property used in the present invention. Other suitable agents may include $((CH_3)_2N)_2Si(R)_2$, where R is methyl, ethyl, methoxy, and/or hydrogen and this type of reagent may cross-link to certain extent but is still workable for the purpose of the present invention. In fact, in some instances, certain level of cross-linking may be desirable in order to improve the CMP behavior of the swelled film, after the dielectric cap is deposited over the gate, as either CMP or etch-back may be needed at that point.

As being described below in more details, organic material layer 305 is a sacrificial layer which is used, according to embodiments of the present invention, to facilitate the formation of dielectric a cap layer on top of gate structures 302 and which may be removed after the formation of such dielectric cap layer.

Figure 4:
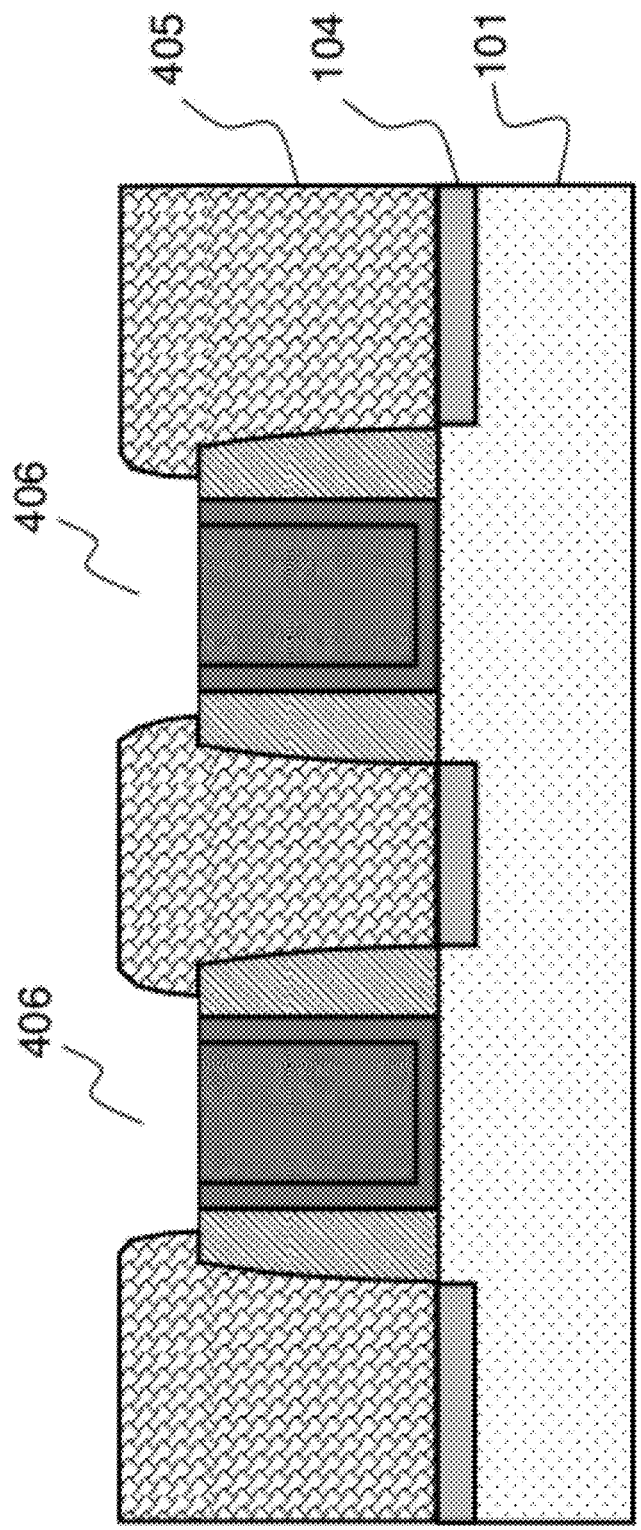
FIG. 4 is a demonstrative illustration of a method of forming borderless contacts for transistors, following the step illustrated in FIG. 3, according to an embodiment of the invention.

FIG. 4 is a demonstrative illustration of a method of forming borderless contacts for transistors, following the step illustrated in FIG. 3, according to an embodiment of the present invention. After polishing down organic material layer 305 of, for example, DUO polymer, embodiment of the present invention applies a silylation reaction process to the organic material layer 305 in order to cause it to swell in a controlled fashion. The process may be run in a vacuum chamber with a load lock, with a heated chuck to hold the wafer and set the reaction temperature. During the silylation process, one or more silylation agents such as those being discussed above may be introduced into the chamber as a vapor to help the expansion process. The vapor agent acts with the polymer and is directly involved in causing the swelling, ie, the added mass of the reagent is the source of the swelling.

According to embodiments of the present invention, in order to control the amount of swelling that organic material layer 305 may experience, which is generally less than about 67% (in volume) and preferably between 30% to 50% (in volume), in order for organic material layer 305 to have a sufficient high height but in the meantime not to cover a top surface of gate structure 302, certain conditions of the silylation process of the organic material layer 305 may be controlled or properly adjusted. For example, in order to achieve the above preferred expansion ratio, it is generally preferable to have a vapor pressure range of the agent, inside the vacuum chamber wherein such silylation process is taking place, between about 1 torr and about 300 torr with between 30 and 100 torr being a more preferred range; to have a temperature range between about 100 degree C. and about 300 degree C. with between abut 150 degree C. and about 250 degree C. being a more preferred range; and have a time duration (under the above conditions) between about 10 seconds and about 300 seconds with a time duration between about 30 and about 90 seconds being a generally more preferred range.

According to another embodiment, the amount of expansion or swelling of organic material 305 may also be affected or controlled by controlling the total amount of organic material 305 surrounding spacers 303 (FIG. 3). For example, the thickness of organic material layer 305 may be adjusted or controlled by intentionally leaving a portion of dielectric layer 105 at the bottom thereof without a complete removal in the previous step, as is illustratively shown in FIG. 10. The thicker of remaining dielectric layer 105a, the less of organic material layer 305 will be. The controlling of expansion of organic material layer 305 ensures that a top surface of gate structures 302 will not be covered by an expanded organic material 405, which will at most cover a portion of a top surface of spacers 303.

According to yet another embodiment, additional spacers and/or space holders maybe formed on top of gate structure 302 to define and/or control where organic material 305 may expand therefore ensuring that top of gate structure 302 are not covered by expanded organic material layer 405. The additional spacers and/or space holders may be selectively removed after the above silylation process of organic material 405.

In order words, embodiment of the present invention may include causing organic material layer 305 to expand or swell to have an increased height that is higher than that of the exposed gate structure 302, but at the same time may cause, at most, only a portion of the top surface of spacers 303 be covered by the expanded organic material 405. Other methods and approaches may be exercised in order to ensure that the expansion of organic material does not cause the top of metal gate 302 to be covered. In fact, the swelled organic material 405 may surround and thereby form an opening 406 through which the entire top surface of metal gate structure 302 may be left un-covered or exposed.

Figure 5:
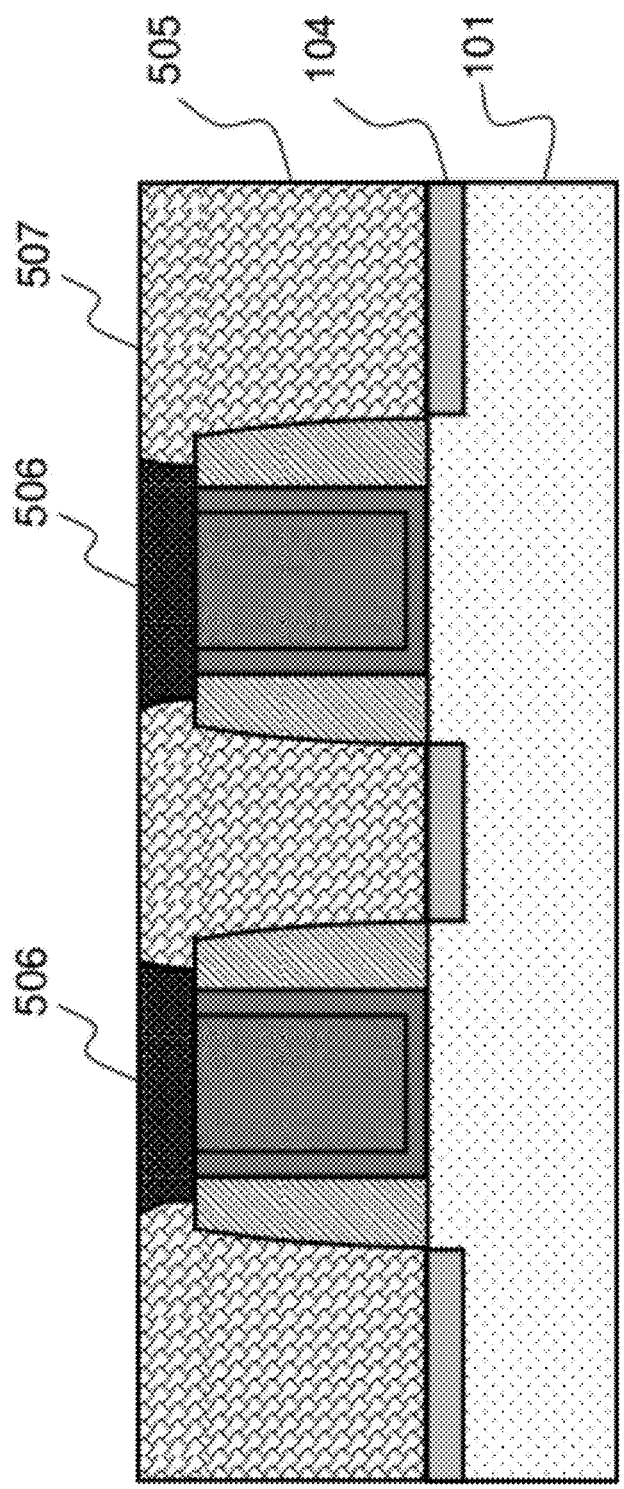
FIG. 5 is a demonstrative illustration of a method of forming borderless contacts for transistors, following the step illustrated in FIG. 4, according to an embodiment of the invention.
Figure 6:
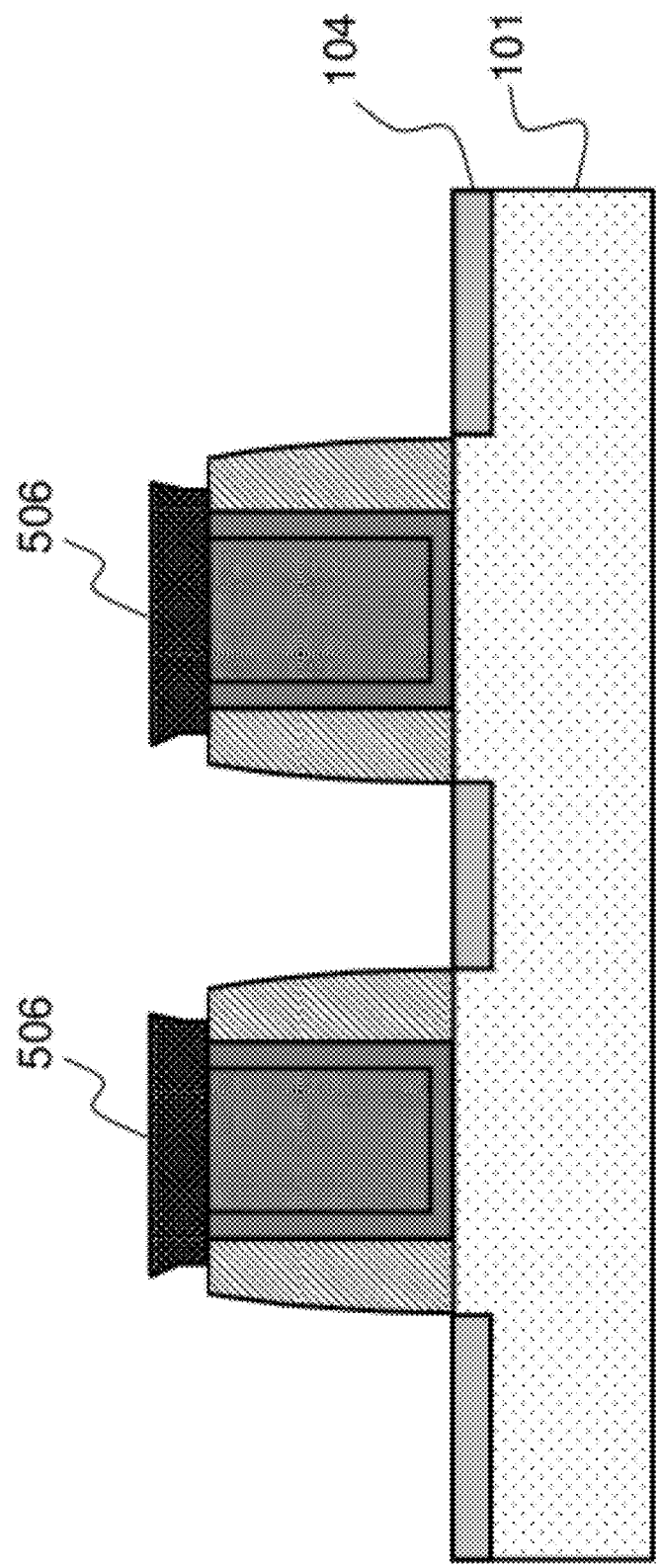
FIG. 6 is a demonstrative illustration of a method of forming borderless contacts for transistors, following the step illustrated in FIG. 5, according to an embodiment of the invention.

FIG. 5 is a demonstrative illustration of a method of forming borderless contacts for transistors, following the step illustrated in FIG. 4, according to an embodiment of the present invention. After forming openings 406 that are surrounded by expanded organic material layer 405, a layer of dielectric material may be deposited in the openings 406, as well as on top of organic material layer 405. Following the deposition of dielectric material, a CMP process may be applied to create dielectric cap layer 506 as well as remove excess dielectric material that are on top of organic material layer 505. The CMP process may create a top surface 507 of organic material layer 505 that is co-planar to that of dielectric cap layer 506. Dielectric cap layer 506 in the openings 406 may serve as an etch-stop layer to protect metal gate structures 302 underneath thereof in subsequent steps of forming conductive studs. FIG. 6 is a demonstrative illustration of a method of forming borderless contacts for transistors, following the step illustrated in FIG. 5, according to an embodiment of the present invention. Similar to the step shown in FIG. 2 in removing dielectric layer 105, sacrificial organic material layer 505 may be removed through, for example, the use of HF, BHF, DHF, and/or some solvents as being listed below. As a few examples, EZStrip 502, ACT® NE-89 (from Air Products), AP-800M, AP-806, AP-810, AP-811 (from ATMI), DAAF-C100/150/C200/C300/C350, DAIF-C150/C200/C300 (from Daikin), EKC5610™-DP and/or EKC5625™-DP (from DuPont EKC), and/or CLK-888 (from Mallinckrodt Baker) may be used in removing expanded sacrificial organic material layer 505.

According to one embodiment, when a portion of dielectric layer 105 is left remaining on top of substrate 101 during the removal of sacrificial dielectric layer 105, as being illustrated in FIG. 10, the remaining dielectric layer 105a may be at this stage selectively removed as well through, for example, an RIE process. Alternatively as another embodiment, any remaining dielectric layer 105a underneath organic material layer 505, depending on the type of dielectric material used, may form a part of a final dielectric layer 705 (FIG. 7) which surrounds metal gate structures 302.

The removal process of organic material layer 505 (and any dielectric layer underneath thereof if any) exposes metal gate structures 302 that is surrounded by spacers 303. The metal gate structure 302 is covered by etch-stop layer 506 formed on top thereof as is shown in FIG. 6.

Figure 7:
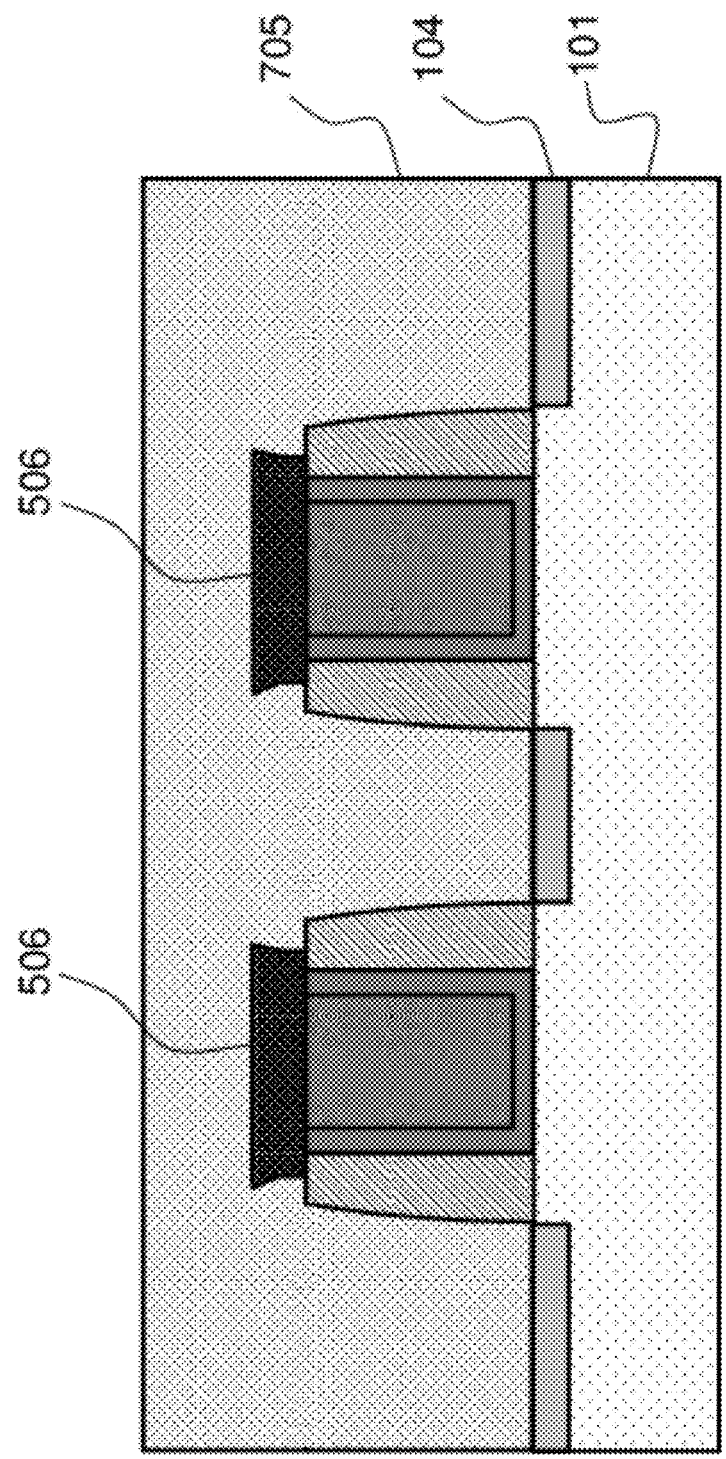
FIG. 7 is a demonstrative illustration of a method of forming borderless contacts for transistors, following the step illustrated in FIG. 6, according to an embodiment of the invention.

FIG. 7 is a demonstrative illustration of a method of forming borderless contacts for transistors, following the step illustrated in FIG. 6, according to an embodiment of the present invention. In this particular step, a dielectric layer 705 may be deposited to cover both the exposed gate structures 302, substrate 101 including silicided regions 104 and cover the top of etch-stop layer 506. Material of dielectric layer 705 may be same or different from dielectric layer 105 which may partially depend on whether the entire dielectric layer 105 is being used as a sacrificial layer in the process.

Figure 8:
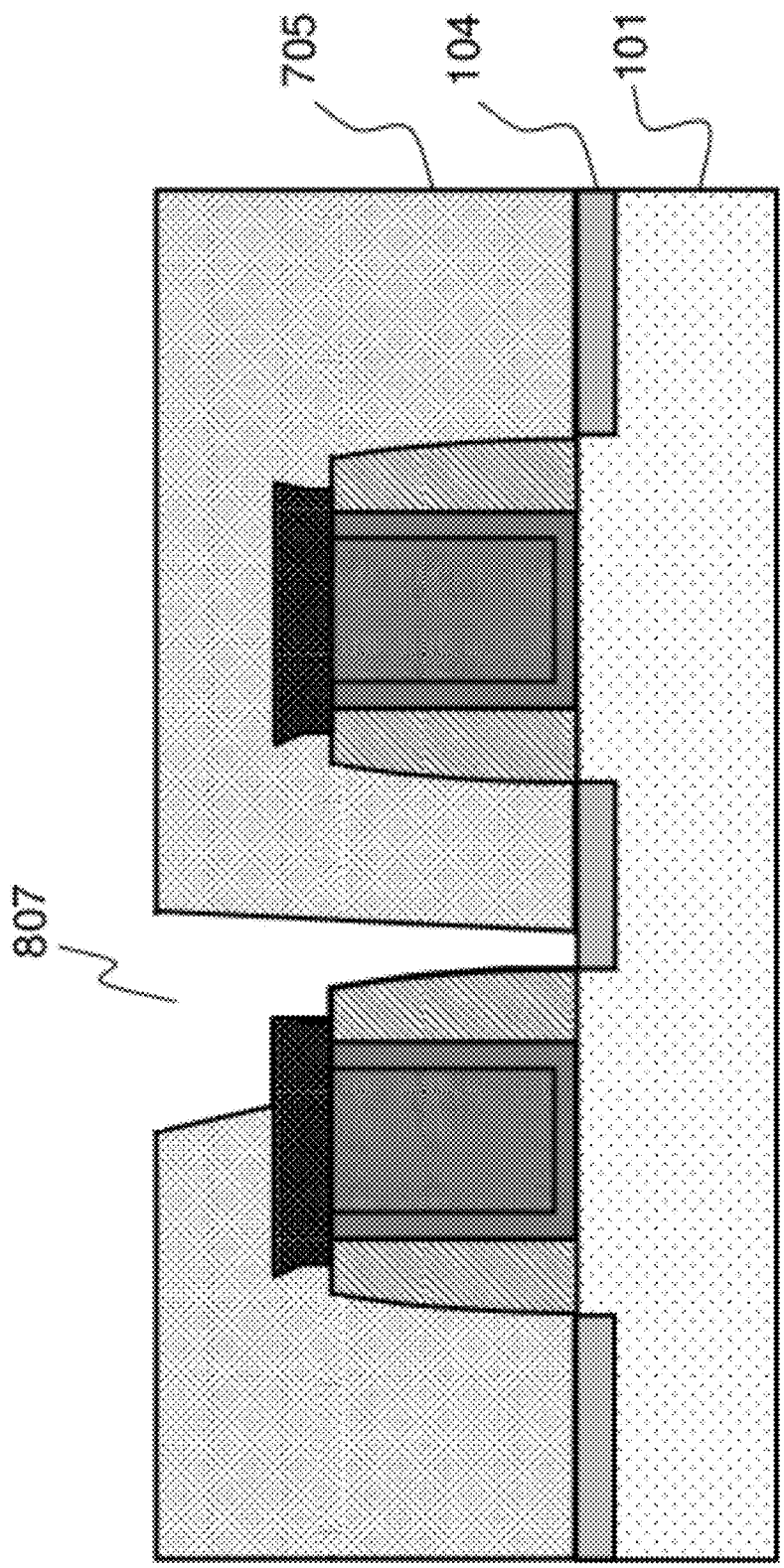
FIG. 8 is a demonstrative illustration of a method of forming borderless contacts for transistors, following the step illustrated in FIG. 7, according to an embodiment of the invention.

Next, one or more via openings 807 may be formed inside dielectric layer 705 next to the spacers 303 of gate structures 302 to expose source/drain regions 104 of transistors 110 and 120, as is demonstratively illustrated in FIG. 8, using conventional photolithographic process. During the process, dielectric cap layer 506 helps preserve the integrity of metal gate structures 302 underneath thereof to prevent possible etching (during the formation of via opening 807) related erosion and/or damage to the metal gate structures 302.

Figure 9:
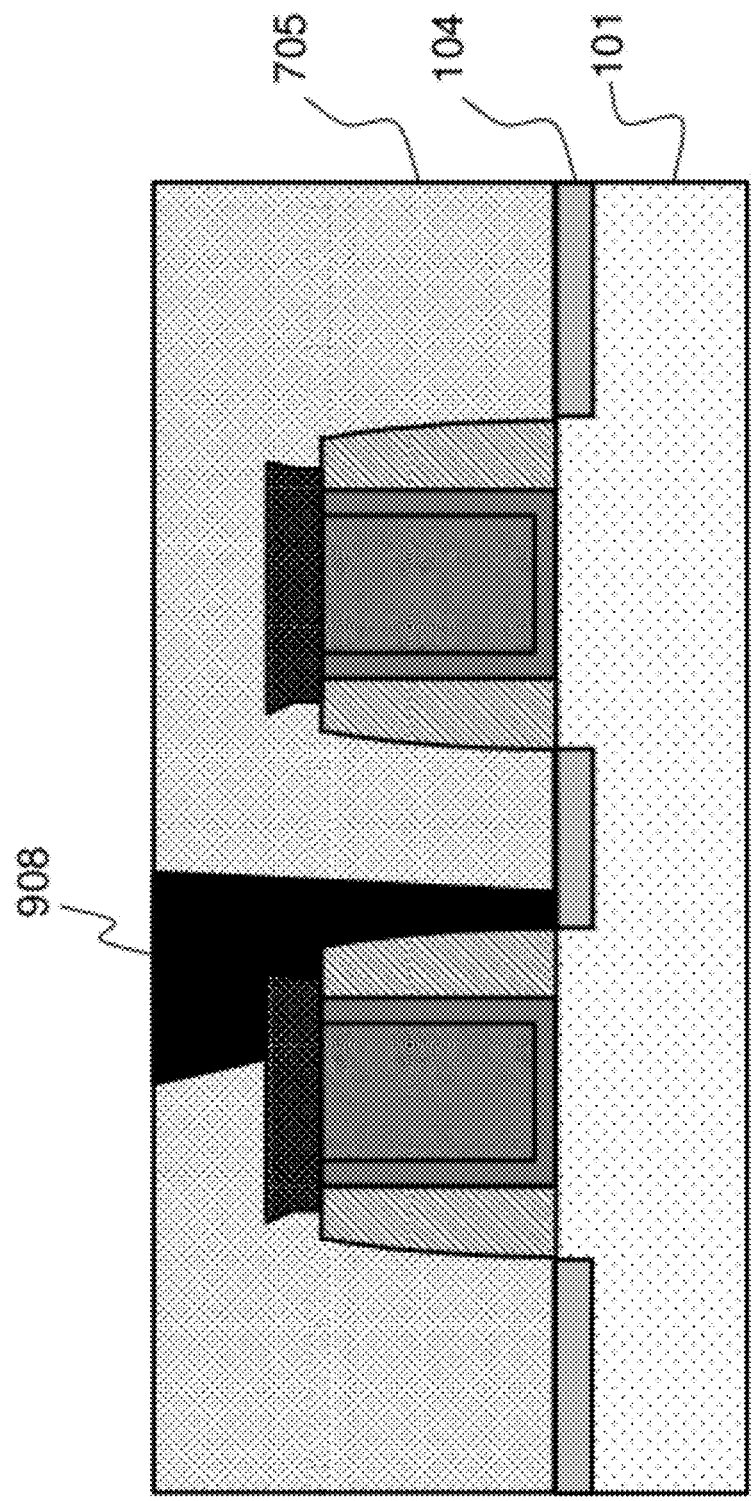
FIG. 9 is a demonstrative illustration of a method of forming borderless contacts for transistors, following the step illustrated in FIG. 8, according to an embodiment of the invention.

Embodiment of the present invention further includes filling via openings 807 with one or more conductive materials such as copper (Cu), tungsten (W), and any other suitable conductive materials to form conductive stud 908 as being illustrated in FIG. 9. An aluminum (Al) liner may be formed next to the sidewalls of via openings 807 as a diffusion barrier layer. Conductive stud 908 may be electrically insulated from gate structure 302 by etch-stop layer 506, which covers only the top surface of gate structure. Conductive stud 908 is formed directly next to spacers 303 and therefore is generally known as borderless to gate structure 302, which saves spaces that otherwise may exist between spacer 303 and conductive stud 908. Conductive stud 908 may be made to be in contact with source/drain silicide 104.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:
1. A method comprising:
   forming a gate of a transistor, on top of a substrate, and spacers adjacent to sidewalls of said gate;
   forming a sacrificial layer surrounding said gate;
   causing said sacrificial layer to expand in height to become higher than said gate, said expanded sacrificial layer covering at most a portion of a top surface of said spacers and thereby leaving an opening on top of said gate surrounded by said spacers;
   filling said opening with a dielectric cap layer;
   replacing said expanded sacrificial layer with a dielectric layer; and
   forming a conductive stud contacting source/drain of said transistor, said conductive stud being isolated from said gate by said dielectric cap layer.

2. The method of claim 1, wherein said sacrificial layer is a layer of organic material and wherein forming said sacrificial layer surrounding said gate comprises:
   spinning on said organic material on top of said gate and in areas around said gate; and
   polishing said organic material to expose said gate and said spacers surrounding said gate and to create a top surface of said organic material co-planar with that of said gate and said spacers.

3. The method of claim 2, wherein said organic material in areas around said gate is formed directly on top of said substrate covering said source/drain of said transistor.

4. The method of claim 3, wherein said organic material is a polymer having a chemical component of $(Si(OH)(OR)O_2)$, where R is either an aryl group comprising one or more of phenyl, tolyl, and xylyl, or an alkyl group comprising one or more of methyl, ethyl, propyl, butyl, and t-butyl group.

5. The method of claim 3, wherein said organic material further comprises one or more silylation agents represented by $(CH_3)_2NSi(R)_3$ wherein R methyl, ethyl, methoxy, or hydrogen or represented by $((CH_3)_2N)_2Si(R)_2$ wherein R is methyl, ethyl, methoxy, or hydrogen.

6. The method of claim 2, wherein said dielectric layer is a second dielectric layer and wherein said organic material in areas around said gate is formed on top of a first dielectric layer, a thickness of said first dielectric layer that is formed directly on top of said substrate being adjusted to control the amount of organic material being formed around said gate.

7. The method of claim 4, wherein causing said sacrificial layer to expand comprises subjecting said organic material to a silylation reaction process under a pre-determined temperature, pressure of one or more silylation agents, and time duration.

8. The method of claim 7, wherein said temperature, pressure, and time duration is adjusted to control said expansion of said organic material to a range below approximately 67%.

9. The method of claim 8, wherein said range of expansion is between about 30% and about 50%.

10. The method of claim 8, wherein said range of expansion is affected by said amount of organic material around said gate which is in turn determined by said thickness of said first dielectric layer.

11. The method of claim 1, wherein said filling said opening with a dielectric cap layer comprises depositing a dielectric layer on top of said exposed gate and said sacrificial layer and subsequently polishing said dielectric layer to expose said sacrificial layer underneath thereof.

12. A method comprising:
   forming a gate of a transistor with sidewall spacers on top of a substrate and an organic layer surrounding said sidewall spacers;
   causing said organic layer to expand in height to become higher than said gate, said expanded organic layer leaving at least a top surface of said gate uncovered;
   covering said top surface of said gate with a dielectric cap layer;
   replacing said expanded organic layer with a dielectric layer; and
   forming a conductive stud contacting source/drain of said transistor, said conductive stud being isolated from said gate by said dielectric cap layer.

13. The method of claim 12, wherein said dielectric layer is a second dielectric layer and wherein said organic layer is formed on top of a first dielectric layer, a thickness of said first dielectric layer that is formed directly on top of said substrate ranging from zero to substantially close to a height of said gate.

14. The method of claim 12, wherein causing said organic layer to expand comprises subjecting said organic material to a silylation reaction process under a pre-determined vapor pressure of one or more silylation agents.

15. The method of claim 14, wherein said one or more silylation agents are represented by $(CH_3)_2NSi(R)_3$ with R being methyl, ethyl, methoxy, or hydrogen or represented by $((CH_3)_2N)_2Si(R)_2$ with R being methyl, ethyl, methoxy, or hydrogen.

16. The method of claim 15, wherein said organic layer is formed directly on top of said substrate and wherein causing said organic layer to expand comprises causing said organic layer to swell in volume by between about 30% and about 50%.

17. The method of claim 16, wherein causing said organic layer to swell between about 30% and about 50% comprises controlling said pre-determined vapor pressure between about 30 and about 100 torr, controlling a temperature range during said silylation reaction process between about 150 degree C. and about 250 degree C., and controlling a time duration of said silylation reaction process between about 30 seconds and about 90 seconds.

18. A method of forming borderless contact comprising:
   forming a gate of a transistor, on top of a substrate, and spacers adjacent to sidewalls of said gate;
   forming an organic layer surrounding said gate;
   causing said organic layer to expand to become higher than said gate, said expanded organic layer leaving a top surface of said gate being exposed;
   covering said exposed top surface of said gate with a dielectric cap layer;
   forming a conductive stud contacting source/drain of said transistor, said conductive stud being isolated from said gate by said dielectric cap layer and said spacers.

19. The method of claim 18, wherein forming said organic layer surrounding said gate comprises:
   spinning on an organic material on top of said gate and in areas around said gate; and
   lowering a height of said spinned-on organic material to expose said gate and said spacers surrounding said gate thereby creating said organic layer, said organic layer having a top surface that is co-planar or lower than a top surface of said gate and said spacers.

20. The method of claim 19, wherein said lowering said height of said spinned-on organic material comprising polishing said organic material through a chemical-mechanic-polishing process or wet etching said organic material using aqueous base solutions.

21. The method of claim 18, wherein causing said organic layer to expand comprises subjecting said organic layer to a silylation reaction process under a pre-determined temperature, pressure of one or more silylation agents, and time duration.

22. The method of claim 21, further comprising controlling said pre-determined temperature between about 150 degree C. and about 250 degree C., said pressure of said one or more silylation agents between about 30 and about 100 torr, and said time duration between about 30 seconds and about 90 seconds to cause said organic layer to become higher than said gate but leave said top surface of said gate being exposed.

* * * * *